United States Patent [19]
Morozumi et al.

[11] 3,935,546
[45] Jan. 27, 1976

[54] COMPLEMENTARY MOS TRANSISTOR CRYSTAL OSCILLATOR CIRCUIT

[75] Inventors: Shinji Morozumi, Shimosuwa; Mitsuharu Kodaira, Suwa, both of Japan

[73] Assignee: Kabushiki Kaisha Seikosha, Tokyo, Japan

[22] Filed: Dec. 12, 1973

[21] Appl. No.: 423,961

[30] Foreign Application Priority Data
Dec. 12, 1972 Japan.............................. 47-124665

[52] U.S. Cl............ 331/116 R; 331/108 D; 331/175
[51] Int. Cl.²......................................... H03B 5/36
[58] Field of Search............ 331/116 R, 108 D, 175, 331/176; 58/23 R, 23 A, 23 AC; 307/303; 357/42, 51

[56] References Cited
UNITED STATES PATENTS

| | | |
|---|---|---|
| 3,534,236 | 10/1970 | Bean et al........................ 357/51 X |
| 3,667,009 | 5/1972 | Rugg.................................... 357/42 |
| 3,725,822 | 4/1973 | Eaton, Jr..................... 331/116 R X |
| 3,829,795 | 8/1974 | Minney......................... 331/116 R |

Primary Examiner—Siegfried H. Grimm
Attorney, Agent, or Firm—Blum, Moscovitz, Friedman & Kaplan

[57] ABSTRACT

A monolithic integrated quartz crystal oscillator circuit having a resistance between the inverter output and the quartz crystal vibrator in order to stabilize the frequency characteristics thereof. An inverter including complementary coupled N-channel and P-channel MOS field effect transistors, and an output resistance at the drain connected terminals thereof, are monolithically integrated into a single chip. The resistance at the output terminal of the complementary coupled inverter effects a stabilization of the frequency of the quartz crystal oscillator circuit during changes in the supply voltage.

5 Claims, 3 Drawing Figures

COMPLEMENTARY MOS TRANSISTOR CRYSTAL OSCILLATOR CIRCUIT

BACKGROUND OF THE INVENTION

This invention relates generally to an improved quartz crystal oscillator circuit for use in an electronic timepiece and especially to a monolithic integrated quartz crystal oscillator circuit for stabilizing the oscillating frequency thereof during changes in the supply voltage. Heretofore, certain problems have existed in quartz crystal oscillator circuits formed from complementary coupled MOS transistors. In particular, significant changes in the frequency of such circuits were caused by changes in the supply voltage. Similarly, when the supply voltage of the quartz crystal circuit were stabilized, variations in the threshold voltage of the MOS field effect transistors used would also effect a substantial change in the frequency thereof. The change in frequency was caused by a reduction in the output impedance of the inverter formed by the complementary coupled P-channel and N-channel transistors which were reduced in proportion to the increase in the supply voltage and/or threshold voltage.

SUMMARY OF THE INVENTION

Generally speaking, in accordance with the invention, a monolithic integrated quartz crystal oscillator circuit is provided wherein the frequency of such circuit is substantially stabilized in the event of changes in the supply voltage or threshold voltages. The quartz crystal oscillator circuit includes complementaty MOS field effect transistors for oscillating a quartz crystal vibrator, at least one stage of the complementary inverter being comprised of a P-channel transistor and an N-channel transistor. A resistor is coupled to the inverter at the drain connecting terminals to define an output terminal which is coupled through the quartz crystal vibrator and a feedback resistance to an input terminal defined by the gate connecting terminals of the inverter. The output terminal and input terminal are coupled to ground through capacitors. By selecting the resistance between the drain connecting terminal and the output terminal to be of a specific order, with respect to the equivalent resistance of the quartz crystal vibrator, the changes in the oscillating frequency of the crystal oscillator circuit is substantially stabilized.

An improved quartz crystal oscillator circuit is provided by monolithically integrating the output resistor into a chip which includes the monolithically integrated inverter circuit.

Accordingly, it is an object of this invention to provide an improved quartz crystal oscillator circuit wherein changes in the supply voltage have a minimum effect on the frequency characteristic thereof.

It is a further object of this invention to provide an improved quartz crystal oscillator circuit wherein the oscillation thereof is stabilized with respect to changes in the supply voltage and/or threshold voltage.

It is still another object of this invention to provide a quartz crystal oscillator circuit wherein the resistance required to stabilize the operating frequency is monolithically integrated with the MOS field effect transistors comprising the inverter circuit.

It is still another object of this invention to provide a quartz crystal oscillator circuit having monolithically integrated circuit elements for use in an electronic timepiece.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCEPTION OF THE DRAWINGS

For a fuller understanding of the invention, reference is had to the following description taken in connection with the following drawings, in which.

DESCRIPTION OF THE PREFERRED EMBODIMENT

Figure 1:
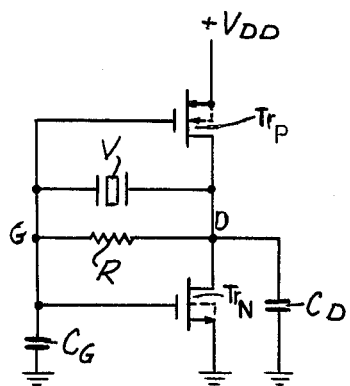
FIG. 1 is a circuit diagram of a quartz crystal oscillator circuit constructed in accordance with the prior art.
Figure 3:
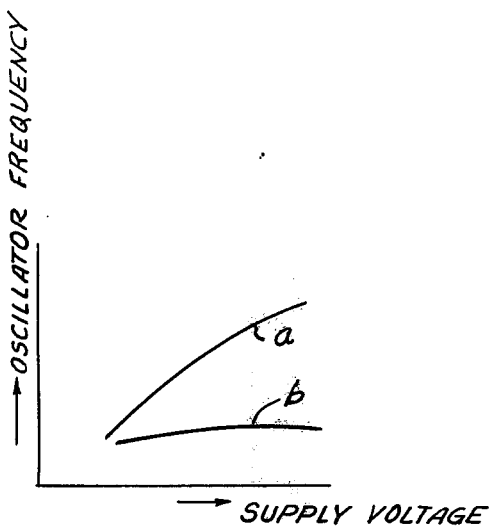
FIG. 3 is a graph of the source voltage-oscillating frequency characteristic of the quartz crystal oscillator circuits depicted in FIG. 1 and FIG. 2.

Reference is now made to FIG. 1, wherein a quartz crystal oscillator circuit, in which P-channel MOS field effect transistor $Tr_P$ is complementary coupled to N-channel MOS field effect transistor $Tr_N$ at the drain terminals thereof, the define an output terminal D. The output terminal D defined by the connection of the drain terminals of transistors $Tr_P$ and $Tr_N$ is coupled through a feedback resistor R and through a quartz crystal vibrator V to the input of the quartz crystal oscillator circuit defined by the connection of the gate terminals of complementary connected MOS transistors $Tr_P$ and $Tr_N$. In order to effect phase compensation, the output terminal D and the input terminal G are grounded through output capacitor $C_D$ and input capacitor $C_G$, respectively. By the coupling of the output terminal D to the input terminal G through the feedback resistance R, the circuit is rendered self-oscillatory, to thereby set an operating point thereof. It is noted that when changes occur in the supply voltage or when changes in threshold voltages occur in the circuit of FIG. 1, the oscillating frequency is significantly increased as the supply voltage increases, as is depicted by curve a in FIG. 3.

Figure 2:
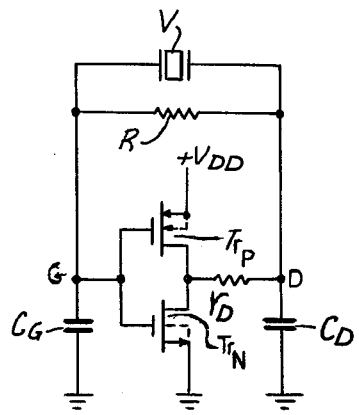
FIG. 2 is a circuit diagram of a monolithically integrated quartz crystal oscillator circuit including an output resistance and constructed in accordance with the instant invention.

Reference is now made to FIG. 2, wherein like reference numerals are used to denote like elements depicted in FIG. 1. The drain connecting terminals are coupled through a resistor $r_D$ to the output terminal D. By selecting $r_D$ to be a certain magnitude, the change in oscillating frequency is substantially reduced with respect to changes in the supply voltage. A comparison of the improvement achieved by the inclusion of such a resistance is depicted in curve b of FIG. 3. In order to achieve such results it is necessary to select $r_D$ to be on the order of the equivalent resistance of the quartz crystal vibrator utilized, it being recognized that resistors of the order of 10 K-ohms to several hundred K-ohms perform desirable results.

It has further been found advantageous in practicing the instant invention to include portions of the oscillator circuit depicted in FIG. 2 on a single substrate. It is appreciated, that when a complementary MOS transistor is produced, a lightly doped P-type layer is diffused to an N-type substrate, and then a heavily doped N- type layer is diffused into such substrate to form an N-channel transistor. If a high resistance is desired, it is possible to lightly dope the P-type layer and use same as a resistor. As is appreciated, if such a P-type layer is utilized to obtain the desired resistance between the drain connecting terminal and the output terminal, a significant advantage inures to such manufacture because the resistance is easily provided by diffusing the P-type layer which is a necessary step in treating an N-channel substrate when a complementary MOS transistor is produced. Nevertheless, utilizing such an arrangement is restricted by the expansion of the P-type layer. However, when a polycrystalline silicon is used to effect the required resistance, only a space for the above mentioned resistance is necessary, seldom imposing any other restrictions on the other circuit elements to be incorporated on the same substrate.

Thus, a stable oscillating frequency can be obtained by supplying an output resistor to the drain of a quartz crystal oscillating circuit utilizing a complementary MOS transistor circuit, wherein the output resistor can be incorporated into a monolithically integrated circuit chip to provide an improved quartz crystal oscillator circuit.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A quartz crystal oscillator circuit comprising a quartz crystal vibrator, an output resistor, a feedback resistor, and an inverter circuit said inverter circuit including an N-channel and a P-channel MOS field effect transistor coupled at the drain terminals thereof to a first side of the output resistor, the other side of the output resistor defining an output terminal, said output terminal being coupled through said vibrator to said input terminal of said inverter circuit defined by a coupling of the gate terminals of said transistors, said output terminal being further coupled through said feedback resistor to said gate terminals of said transistors.

2. A quartz crystal oscillator circuit as claimed in claim 1, wherein said output terminal is coupled through a capacitor to ground.

3. A quartz crystal oscillator circuit as claimed in claim 1, wherein said input terminal is coupled through a capacitor to ground.

4. A quartz crystal oscillator circuit as claimed in claim 2, wherein said input terminal is coupled through a capacitor to ground.

5. A quartz crystal oscillator circuit as claimed in claim 1, wherein said output resistor is of the order of 10 K-ohms to 500 K-ohms.

* * * * *